United States Patent [19]
Wolkstein et al.

[11] Patent Number: 5,884,143
[45] Date of Patent: Mar. 16, 1999

[54] SPACECRAFT WITH PARALLELED AMPLIFIERS AND REDUNDANCY

[75] Inventors: Herbert Joseph Wolkstein, Livingston; Thaddeus Arthur Hawkes, Haddonfield, both of N.J.

[73] Assignee: Lockheed Martin Corporation, Sunnyvale, Calif.

[21] Appl. No.: 803,965

[22] Filed: Feb. 21, 1997

[51] Int. Cl.$^6$ .................................................. H04B 7/185
[52] U.S. Cl. .......................... 455/13.4; 455/69; 455/126; 330/107; 333/17.1; 333/109
[58] Field of Search ................................. 455/12.1, 13.4, 455/69, 126, 272, 273, 277.1, 138, 139, 303, 305, 306; 330/107, 286, 295; 333/171.1, 109, 116, 117, 136, 156

[56] References Cited

U.S. PATENT DOCUMENTS

| | | | |
|---|---|---|---|
| 4,701,716 | 10/1987 | Poole | 330/43 |
| 5,222,246 | 6/1993 | Wolkstein | 455/13.4 |

Primary Examiner—Reinhard J. Eisenzopf
Assistant Examiner—Sam Bhattacharya
Attorney, Agent, or Firm—W. H. Meise; S. A. Young

[57] ABSTRACT

A spacecraft includes a plurality of paralleled RF amplifiers. Each paralleled power amplifier (206) includes a signal splitter (222) which produces two nominally equal-amplitude signals, and a signal combiner (242) which combines appropriately phased signals to produce a sum signal at a sum port (250). The signal combiner also includes a null output port (248). A pair of elemental amplifiers (236, 238) is coupled between the splitter outputs and the combiner inputs. In order to allow for phase drift of the elemental amplifiers, at least one phase shifter (258) is associated with one of the elemental amplifiers. A phase control loop is coupled from the null output of the combiner, around the paralleled amplifier arrangement, and controls the phase shifter to maintain the phase within bounds, to maximize the signal at the sum port of the combiner. In order to provide for redundancy, at least one channel (271; 272) of the paralleled amplifier includes the cascade of a phase shifter (258; 259) and a switching arrangement (281) which allows a failed elemental amplifier to be replaced by a redundant unit. No additional phase shifters are required, since the loop phase shifters compensate for differences between failed and redundant amplifiers.

5 Claims, 2 Drawing Sheets

Fig. 2a ns and more particularly to such arrangements using hybrid power combiners for combining the signals from paralleled amplifiers which can be replaced by switch arrangements for redundancy, and which are therefore particularly advantageous for systems, such as spacecraft, located in remote locations, which are difficult to reach for servicing.

BACKGROUND OF THE INVENTION

The paralleling of amplifiers for higher combined power is well known. U.S. Pat. No. 5,222,246, issued Jun. 22, 1993 in the name of Wolkstein describes the paralleling of radio-frequency (RF) amplifiers located on a spacecraft, to achieve higher power. The term RF includes microwave, millimeter-wave, and, generally, signals at frequencies above sonic frequencies. As described in the Wolkstein patent, an RF signal source is coupled to the input of a power splitter, which produces two equal-amplitude signals at its output ports. A hybrid power combiner includes two input ports, and sum and difference output ports. A first channel connects one output port of the splitter to a first input port of the power combiner, and a second channel connects the second output port of the splitter to the second input port of the combiner. As described in the Wolkstein patent, phase shifts between amplifiers being paralleled must be kept within about ten or fifteen degrees, and preferably should be within about five degrees. Simple aging can change the phase characteristics of an RF amplifier, and travelling-wave amplifiers tend to be highly sensitive to their energizing voltage. Since each individual or elemental amplifier of a paralleled amplifier pair may be energized by a separate electronic power controller (EPC), their applied voltages may drift, causing substantial drift of the relative phase during normal operation. A controllable phase shifter coupled in at least one of the channels allows for correction of the phase of the channel in which it resides, and can be adjusted to maximize the combined signal power at the sum output port of the combiner, to thereby compensate for drift. The preferred embodiment uses two phase shifters, one in each channel. In order to provide sensitive control of the phase shifter, an output signal is taken from the null output port of the combiner, processed, and fed back to the phase shifter, in a manner which minimizes the signal at the null port, and therefore maximizes the combined signal at the sum port. In one embodiment of the arrangement of the Wolkstein patent, the signal splitter is a hybrid, and in another embodiment, the signal splitter is resistive, and a compensating phase or delay adjustment is introduced into one of the legs to provide the desired phase relationship for the output hybrid combiner.

In the context of amplifiers which cannot conveniently be accessed for repair, some redundancy schemes may be used. It is well known that RF amplifiers tend to age, and that their characteristics change with age. Thus, the gain of an RF amplifier will tend to decrease with increasing operating time. Similarly, the phase shift may also change with time, as described, for example, in U.S. Pat. No. 4,701,716, issued Oct. 20, 1987 in the name of Poole. In the context of a pair of paralleled amplifiers, it has been the practice to substitute a paralleled amplifier for a defective paralleled amplifier. Thus, in a communications spacecraft having, say, twenty paralleled amplifiers in twenty separate channels, twenty additional paralleled amplifiers would be necessary as spares in order to have two-for-one redundancy, thereby requiring that forty paralleled amplifiers be fabricated and carried by the spacecraft in order to have redundancy for twenty paralleled amplifiers. It is also well known that minimization of excess weight is an important consideration in spacecraft systems. The twenty paralleled amplifiers provided for redundancy of necessity add substantial additional weight.

SUMMARY OF THE INVENTION

In many cases, a paralleled amplifier becomes defective due to a problem in only one of its constituent amplifiers, but when a paralleled amplifier pair is substituted for a defective amplifier pair, that one of the amplifiers which is still operable in the defective pair is thereafter unused. This unused operable amplifier may be considered to be excess weight, which could be reduced if the amplifiers of each parallel pair were to be individually replaceable, notwithstanding the differences between their operating characteristics. The aging effects on the remaining operable one of a pair of paralleled amplifiers makes it difficult to parallel it with a replacement unit, because the replacement unit has not experienced the same life experiences as the remaining operable one of the original amplifiers.

A spacecraft according to the invention includes a paralleled RF amplifier arrangement for amplifying signals from an RF source, and for supplying amplified signals to a load. The paralleled amplifier arrangement includes an input signal splitter including an input port at which the RF signals from the RF source are received, and also includes first and second output ports at which nominally equal-amplitude samples of the input signal are produced. An output hybrid combiner includes first and second input ports, and sum and difference output ports. The sum port is coupled to the load, for combining at the sum port those components of signal applied to the first and second input ports of the combiner which are in phase quadrature, and for coupling to the difference output port those components of signal applied to the first and second input ports of the combiner which are in-phase.

A first channel extends from the first output port of the splitter to the first input port of the combiner. The first channel includes the cascade of a first phase shifter and a first switching arrangement. The first switching arrangement includes a single-pole, multiple-throw first switch having a common pole and at least first and second individual poles which may individually be switched into communication with the common pole of the first switch. The common pole of the first switch is coupled to the first output port of the splitter. In a particular embodiment of the invention, the first phase shifter precedes the first switching arrangement in the first channel, so that the common pole of the first switch is coupled to the first output port of the splitter by way of the first phase shifter. The first channel also includes a single-pole, multiple-throw second switch having a common pole and at least first and second individual poles which may be individually switched into communication with the common pole of the second switch. The common pole of the second switch is coupled to the first input port of the combiner. The first and second switches are ganged together for simultaneous actuation, so that in a first switch state the common poles of the first and second switches connect to the first individual poles of the first and second switches, respectively, and in a second switch state the common poles of the first and second switches are connected to the second individual poles of the first and second switches, respectively. The first switching arrangement further comprises at least first and second amplifier arrangements. Each of the amplifier arrangements includes an input port to which signal to be amplified may be applied, and an output port at which amplified signal appears when signal to be amplified is applied to the input port of the amplifier arrangement. The first amplifier arrangement has its input port coupled to the first individual pole of the first switch and its output port coupled to the first individual pole of the second switch, and the second amplifier arrangement has its input port coupled to the second individual pole of the first switch and its output port coupled to the second individual pole of the second switch, whereby, when the first and second switches have their common poles contacting their first individual poles, the first amplifier arrangement, and not the second amplifier arrangement, is coupled for amplification in the first channel, and when the first and second switches have their common poles contacting their second individual poles, the second amplifier arrangement, and not the first amplifier arrangement, is coupled for amplification in the first channel.

A second channel extends from the second output port of the splitter to the second input port of the combiner. The second channel includes the cascade of a second phase shifter and a second switching arrangement. The second switching arrangement includes a single-pole, multiple-throw third switch. The third switch has a common pole and at least first and second individual poles which may individually be switched into communication with the common pole of the third switch. The common pole of the third switch is coupled to the second output port of the splitter. In an embodiment of the invention, the second phase shifter precedes the second switching arrangement in the cascade, so the common pole of the third switch in this embodiment is coupled to the second output port of the splitter by way of the phase shifter. The second channel also includes a single-pole, multiple-throw fourth switch. The fourth switch has a common pole and at least first and second individual poles which may be individually switched into communication with the common pole of the fourth switch. The common pole of the fourth switch is coupled to the second input port of the combiner. The second and third switches are ganged together for simultaneous actuation, so that in one switch state, the common poles of the third and fourth switches couple to the first individual poles of the third and fourth switches, respectively, and in a second switch state, the common poles of the third and fourth switches couple to the second individual poles of the third and fourth switches, respectively. The second switching arrangement further comprises at least third and fourth amplifier arrangements. Each of the third and fourth amplifier arrangements includes an input port to which signal to be amplified may be applied, and an output port at which amplified signal appears when signal to be amplified is applied to the input port of the amplifier arrangement. The third amplifier arrangement has its input port coupled to the first individual pole of the third switch, and its output port coupled to the first individual pole of the fourth switch. The fourth amplifier arrangement has its input port coupled to the second individual pole of the third switch and its output port coupled to the second individual pole of the fourth switch. As a result of these connections, when the third and fourth switches have their common poles contacting their first individual poles, the third amplifier arrangement, and not the fourth amplifier arrangement, is coupled for amplification in the second channel, and when the third and fourth switches have their common poles contacting their second individual poles, the fourth amplifier arrangement, and not the third amplifier arrangement, is coupled for amplification in the second channel.

A null detection arrangement is coupled to the difference output port of the output hybrid combiner and to at least the first phase shifter, and preferably for controlling a second phase shifter, for controlling the phase of at least the one of the phase shifters in a manner which tends to maximize the signal amplitude at the sum output port of the combiner.

In a particular embodiment of the invention, the input signal splitter comprises a 3 dB, 90° hybrid. The presence of the hybrid provides phase shifts to the signals traversing the first and second channels which reduces the phase correction required in one of the channels. In a particular embodiment of the invention, the null detection arrangement includes an amplitude detector coupled to the difference output port of the hybrid combiner at the spacecraft, for generating a null-representative signal. A modulator is coupled to the null detection arrangement, also at the spacecraft, for modulating the null-representative signal onto an RF carrier to thereby generate modulated carrier. A transmitter at the spacecraft is coupled to the modulator, for transmitting the modulated carrier to a ground station. The transmitter may include the same amplifiers and antennas which are used for the traffic signals, or it may be an independent transmitter. A receiver at the ground station receives the modulated carrier transmitted to the ground station, for generating a received modulated null-representative signal. At the ground station, a demodulator is coupled to the receiver, for demodulating the received modulated null-representative signal, for thereby generating demodulated null-representative signal. A processor, such as a microprocessor ($\mu$P), located at the ground station, processes the null-representative signals, for generating phase shifter control signals. A second modulator at the ground station is coupled to the processor, for modulating the phase shifter control signals onto an RF carrier, to thereby form modulated phase shifter control signals. The modulated phase shifter control signals are applied to a transmitter located at the ground station, for transmitting the modulated phase shifter control signals toward the spacecraft. At the spacecraft, a second receiver receives the modulated phase shifter control signals, for forming received modulated phase shifter control signals. At the spacecraft, a second demodulator is coupled to the second receiver and to at least one of the first and second phase shifters, for demodulating the modulated phase shifter control signals, and for applying the resulting phase shifter control signals to at least the one of the first and second phase shifters of the first and second channels, respectively, in a manner which tends to minimize the null signal at the null port of the combiner, and which thereby tends to maximize the sum signal at the sum port of the power combiner.

In a particular embodiment of the invention, each amplifier position can be filled by any of the redundant units.

BRIEF DESCRIPTION OF THE DRAWING

FIG. 3 plots the magnitude of the signal at the difference port against the phase imbalance at the output hybrid of the arrangement of FIG. 2a.

DESCRIPTION OF THE INVENTION

Figure 1:
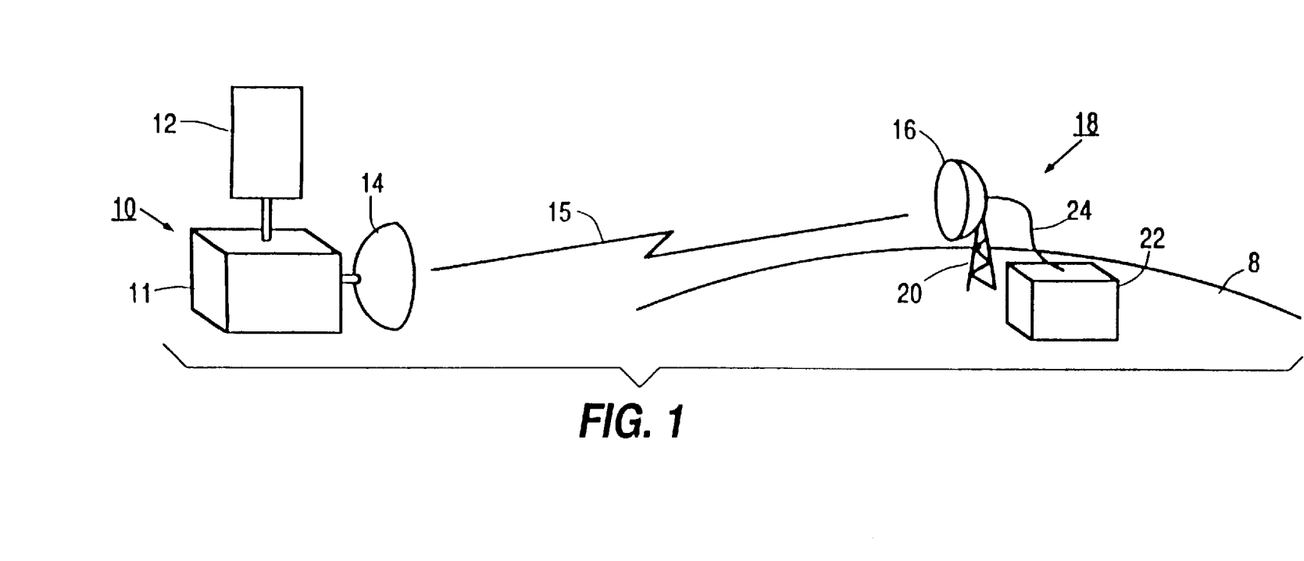
FIG. 1 is a simplified perspective or isometric view illustrating a spacecraft according to an aspect of the invention, communicating with a ground station by way of multiple channels.

In FIG. 1, a spacecraft or satellite designated generally as 10 includes a body 11, on which a solar panel 12 and a reflector-type antenna 14 are mounted. Antenna 14 is directed toward a corresponding antenna 16 at a ground station designated generally as 18, situated on Earth 8. Ground station 18 includes a tower for supporting antenna 16, an equipment housing 22, and transmission lines illustrated as 24, which electrically couple antenna 16 with the equipment (not separately illustrated) located within housing 22. A beam of electromagnetic energy or power, illustrated as 15, extends between antennas 14 and 16, and provides for transmission and reception between antenna 14 and 16 in both directions.

Figure 2A:
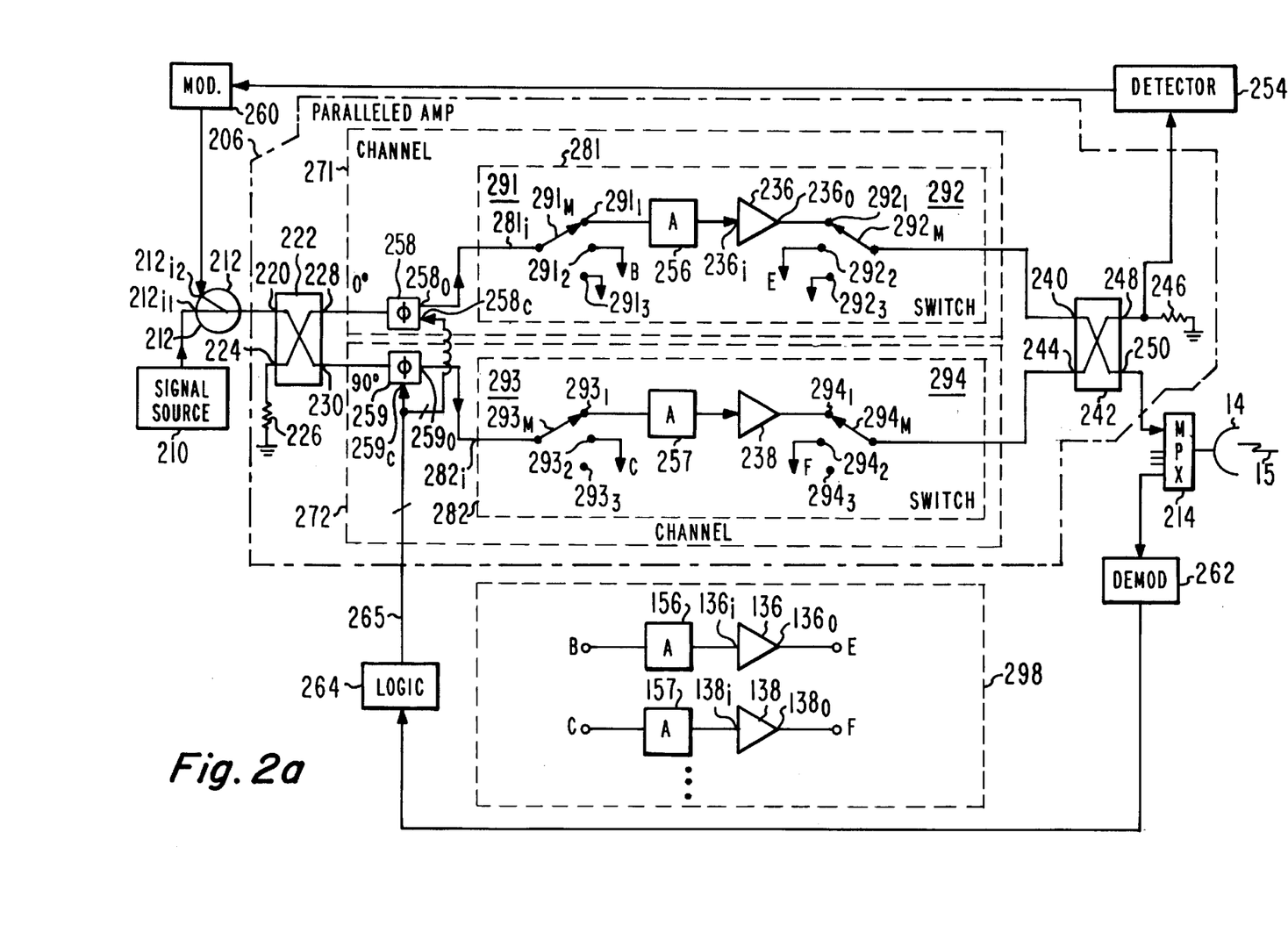
FIG. 2a is a simplified block diagram of a portion of a single channel of the multichannel arrangement of the spacecraft of FIG. 1.

Aboard spacecraft 10 of FIG. 1, a signal source, illustrated as 210 at the left of FIG. 2a, produces signals to be transmitted to the ground station 18 of FIG. 1. These signals may simply be retransmissions of signals originally uplinked to the spacecraft from a ground station, or may represent the results of operation of sensors (not illustrated), such as cameras, aboard the spacecraft 10. Whatever the source of the signals from source 210, the signals to be transmitted to the ground station are applied by way of a first input port $212_{i1}$ and the through path of a directional coupler 212 to an input port 220 of a signal splitter 222. Input port 220 of signal splitter 222 is the input port of a paralleled amplifier designated generally as 206, which includes individual amplifiers 236 and 238, and which also includes an output port 250. Signal splitter 222, as illustrated, is a 3 dB, 90° hybrid, which divides the signal applied to input port 220 into two equal-amplitude portions, which appear at output ports 228 and 230. As known to those skilled in the art, port 224 of splitter 222 is terminated in a matched resistive impedance, illustrated as 226.

At the right of FIG. 2a, a hybrid signal combiner 242 has first and second input ports 240 and 244. Signal combiner 242 combines those components of signal applied to its input ports 240 and 244 which are in phase quadrature (in a 90° phase relation) at its sum (Σ) output port 250, and combines at difference (Δ) output port 248 those components of the input signals which are in-phase, so that they appear across matched termination 246. Those sum signals appearing at sum port 250 of hybrid signal combiner 242 are coupled, by way of a multiplexer/demultiplexer (MPX) 214. Multiplexer/demultiplexer 214 combines the sum signals from combiner 242 with other sum signals from other arrangements corresponding to that of FIG. 2a which are found in spacecraft 10, and applies all of the signals so multiplexed to antenna 14, so that they may be transmitted to earth station 18 of FIG. 1, and possibly to other ground stations (not illustrated). Similarly, signals received at antenna 14 of FIG. 2a from ground station 18, and possibly from other ground stations (not illustrated) are coupled by multiplexer/demultiplexer 214 to a plurality of locations in spacecraft 10, such as, for example, signal source 210, and also to a demodulator 262.

A first channel, identified in FIG. 2a by a dash-line outline 271, extends from output port 228 of signal splitter 222 to input port 240 of signal combiner 242, and a second channel, identified by a dash-line outline 272, extends from output port 230 of signal splitter 222 to input port 244 of signal combiner 242. Thus, all the signal leaving signal splitter 222 traverses one or the other of channels 271 or 272 in order to arrive at the input ports of signal combiner 242. Within first channel 271, a controllable phase shifter 258, with a control input port 258c, is cascaded with a switching arrangement 281, with the output port 258o of phase shifter 258 coupled to switching arrangement 281, so that phase shifter 258 precedes switching arrangement 281 in channel 271. Similarly, within second channel 272, a controllable phase shifter 259, with a control input port 259c, is cascaded with a switching arrangement 282, with the output port 259o of phase shifter 259 coupled to switching arrangement 282, so that phase shifter 259 precedes switching arrangement 282 in channel 272. Phase shifters 258 and 259 are controlled by control signals applied to their control input port 258c and 259c, respectively, over a bus 265, from a logic circuit 264, and are five-bit digital phase shifters in one embodiment of the invention. From the point of view of phase shift alone, the switching arrangements 271 and 272 could precede phase shifters 258 and 259, respectively, but the illustrated locations of the phase shifters have the advantages that (a) the phase shifters are not subjected to the high signal power levels that they would be subjected to in the alternate location, and (b) the unavoidable attenuation of the phase shifters does not reduce the maximum available output power of the system.

Switching arrangement 281 of FIG. 2a includes a first single-throw, multipole RF switch 291, illustrated by a mechanical switch symbol, although those skilled in the art recognize that appropriate solid-state equivalents suitable for RF operation are required. Switch 291 includes a "movable" or common element $291_M$ which is coupled to the output 258o of phase shifter 258, and it also includes a plurality of "contact terminals" $291_1$, $291_2$, $291_3$, . . . . Switch 291 can be actuated to "move" the common element $291_M$ into "contact" with any one of the contact terminals $291_1$, $291_2$, $291_3$, . . . , where the word "contact" refers to both contact and noncontact coupling in the context of RF signals.

Switching arrangement 281 of FIG. 2a also includes a second single-throw, multipole switch 292, which includes a "movable" common element $292_M$, which is coupled to the input port 240 of signal combiner 242. Switch 292 also includes a plurality of contact terminals $292_1$, $292_2$, $292_3$, . . . Switch 292 can be actuated to "move" the common element $292_M$ into contact or coupling with any one of the contact terminals $292_1$, $292_2$, $292_3$, . . . . Switch 292 is ganged with switch 291 for simultaneous operation therewith, in known fashion. Thus, when switches 291 and 292 are in a first state such as that illustrated, their common elements are in contact with those switch contact terminals designated by the "1" subscript, namely the common element $291_M$ of switch 291 is in contact with contact terminal 2911, and common element $292_M$ of switch 292 is in contact with contact terminal $292_1$. Similarly, in a second operating state of ganged switches 291 and 292, their common elements $291_M$ and $292_M$ are in contact with contact terminals $291_2$ and $292_2$, respectively, and in a third operating state of ganged switches 291 and 292, their common elements $291_M$ and $292_M$ are in contact with contact terminals $291_3$ and $292_3$, respectively. In other operating states, switches 292 and 292 switch into contact with other sets of contact terminals, not illustrated. An individual RF amplifier is illustrated as a block 236, with its input port coupled to contact terminal $291_1$ of switch 291, and with its output port coupled to contact terminal $292_1$ of switch 292. Those skilled in the art will recognize that the block designated as 236 may, include frequency and distortion equalizers, multiple stages of amplification, AGC or AOC, and various other functions ordinarily associated with amplification. Thus, in the illustrated state of the switches of FIG. 2a, a path for the flow of signal extends from output port 228 of signal splitter 222, through phase shifter 258 of channel 271, and through switching arrangement 281 by way of contact terminal $291_1$ of switch 291, through amplifier 256, and through switch 292 by way of contact terminal 2921 to input port 240 of output hybrid combiner 242.

Switching arrangement 282 of FIG. 2a includes a first single-throw, multipole switch 293, illustrated by a mechanical switch symbol. Switch 293 includes a "movable" or common element $293_M$ which is coupled to the output of phase shifter 259, and it also includes a plurality of "contact terminals" $293_1, 293_2, 293_3, \ldots$ Switch 293 can be actuated to "move" the common element $293_M$ into "contact" with any one of the contact terminals $293_1, 293_2, 293_3, \ldots$ where the word "contact" refers to both contact and noncontact coupling in the context of RF signals.

Switching arrangement 282 of FIG. 2a also includes a second single-throw, multipole switch 294, which includes a "movable" common element $294_M$, which is coupled to the input port 244 of signal combiner 242. Switch 294 also includes a plurality of contact terminals $294_1, 294_2, 294_3, \ldots$ Switch 294 can be actuated to "move" the common element $294_M$ into contact or coupling with any one of the contact terminals $294_1, 294_2, 294_3, \ldots$ Switch 294 is ganged with switch 293 for simultaneous operation therewith, in known fashion. Thus, when switches 293 and 294 are in a first state such as that illustrated, their common elements are in contact with those switch contact terminals designated by the "1" subscript, namely the common element $293_M$ of switch 293 is in contact with contact terminal $293_1$, and common element $294_M$ of switch 294 is in contact with contact terminal $294_1$. Similarly, in a second operating state of ganged switches 293 and 294, their common elements $293_M$ and $294_M$ are in contact with contact terminals $293_2$ and $294_2$, respectively, and in a third operating state of ganged switches 293 and 294, their common elements $293_M$ and $294_M$ are in contact with contact terminals $293_3$ and $294_3$, respectively. In other operating states, switches 294 and 294 switch into contact with other sets of contact terminals, not illustrated. An individual RF amplifier is illustrated as a block 238, with its input port coupled to contact terminal $293_1$ of switch 293, and with its output port coupled to contact terminal $294_1$ of switch 294. Individual amplifier 238 may include multiple stages, equalizers, and other AGC or AOC loops, and other functions, much as amplifier 236.Thus, in the illustrated state of the switches of FIG. 2a, a path for the flow of signal extends from output port 230 of signal splitter 222, through phase shifter 259 of channel 272, and through switching arrangement 282 by way of contact terminal $293_1$ of switch 293, through amplifier 257, and through switch 294 by way of contact terminal $294_1$, to input port 244 of output hybrid combiner 242.

So far, the connections of the additional contact terminals of the various switches of FIG. 2a have not been described. As illustrated, contact terminal $291_2$ of switch 291 is coupled, as indicated by the letter "B," to the input port of a controllable attenuator (A) 156, which in turn is coupled to the input port 136i of a further or supernumerary amplifier 136. The output port 136o of amplifier 136 is coupled, as indicated by the letter "E," to contact terminal $292_2$ of switch 292. Similarly, contact terminal $293_2$ of switch 293 is coupled, as indicated by the letter "C," to the input port of a controllable attenuator (A) 157, which in turn is coupled to the input port 138i of a further or supernumerary amplifier 138. The output port 138o of amplifier 138 is coupled, as indicated by the letter "F," to contact terminal $294_2$ of switch 294. With these connections, throwing switch set 291/292 from its contact 1 state to its contact 2 state substitutes the cascade of attenuator 156 and amplifier 136 for amplifier 236 of channel 271, and throwing switch set 293/294 from its contact 1 state to its contact 2 state substitutes the cascade of attenuator 157 and amplifier 138 for amplifier 238 of channel 272.

As so far described above, the arrangement of FIG. 2a represents, among other things, a paralleled RF amplifier 206 in which the input port is port 220 of splitter 222, and the output port is sum port 250 of combiner 242. The two constituent or individual amplifiers of the combined amplifier 206 are 236 and 238. During use of the two elemental amplifiers 236 and 238 over a period of years, they tend to be subjected to the same environmental conditions, signal voltage, power level, and operating voltage. Consequently, they tend to degrade in the same manner, although the degradation is not uniform. The amplitude balance required for successful signal or power combination in hybrid combiner 242 may be maintained in any conventional manner, as for example by an automatic gain control (AGC) loop (not illustrated) in conjunction with equal signal amplitude at the outputs of attenuators 291, 292, or by an automatic output level control (AOC) (also not illustrated) coupled around each individual amplifier 236, 238, 136, 138, . . . . Since the amplitudes of the signals are maintained substantially equal by conventional means, such as the aforementioned AOC loops, only the phase requires additional correction. A phase correction arrangement is also provided for maintaining the phase balance required for effective combining is maintained. The phase balance is maintained by a phase control loop including a detector 254 coupled to null output port 248 of hybrid combiner 242. The detector generates a baseband signal representing the magnitude of the signal at the null port, which is, in theory, an indication of the deviation of the signals at combiner hybrid input signal ports 240 and 244 from equal amplitude and phase quadrature. Since the amplitude balance is maintained by the AGC or AOC, the null signal must be due in large part to phase imbalance, so the null signal produced by detector 254 actually represents phase imbalance of the two signals at input ports 240 and 244 of hybrid signal combiner 242. The detected phase imbalance signal is applied from detector 254 to a modulator 260, in which it is modulated onto an RF carrier, and the RF carrier modulated with the phase-representative null signal is coupled to a port $212_{i2}$ of coupler 212, so that the modulated RF signal modulated with the null signal is coupled, together with the traffic signal from signal source 210, to input port 220 of signal splitter 222, which is the input port of the paralleled amplifier 206. The RF traffic signal, together with the RF signal modulated with the null signal, are amplified by the parallel amplifier 206, and coupled from port 250 of hybrid combiner 242 to an input port of multiplexer/demultiplexer 214. Multiplexer/demultiplexer 214 combines the signal from paralleled amplifier 206, and from other similar paralleled amplifiers (not illustrated) which may be on-board the spacecraft, and applies the signals to antenna 14, for transmission over a downlink portion of signal path 15.

Figure 2B:
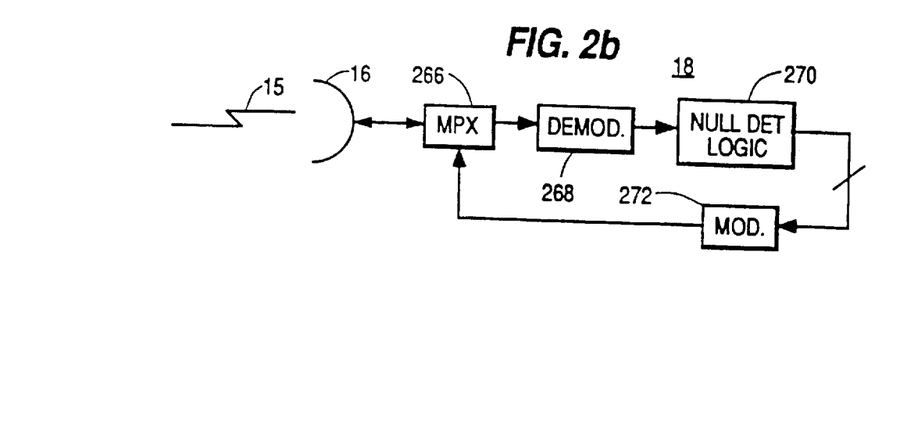
FIG. 2b represents a control portion of the ground station of FIG. 1.

FIG. 2b is a simplified block diagram of the equipment located at ground station 18 which is used to control the combining phase at input ports 240 and 244 of hybrid combiner 242 of FIG. 2a. In FIG. 2b, antenna 16 couples the signals received from the spacecraft over signal path 15, and couples the received signal to a multiplexer/demultiplexer 266, which separates the signals from the various spacecraft, and also separates the traffic signals from the modulated null signals. The modulated null signals from spacecraft 10 are coupled to a demodulator 268, which demodulates the null-representative signal from the carrier, and applies the null signal to a logic circuit 270. Null detection logic 270 processes the null signal in the same manner as that described in U.S. Pat. No. 5,222,246, issued Jun. 22, 1993 in the name of Wolkstein, to ultimately produce a control signal which controls the phase shifters 258 and 259 of paralleled amplifier 206 of FIG. 2a. The control signal is applied from logic 270 to a modulator 279, which modulates the control signal onto a carrier, and applies the modulated control signal to multiplexer 266 for uplink or transmission by an uplink portion of signal path 15 back to the spacecraft.

At the spacecraft 10 of FIG. 1, the uplinked modulated control signal is applied from an uplink portion of signal path 15 to antenna 14, which couples the signal to a common port of multiplexer/demultiplexer 214. Multiplexer/ demultiplexer 214 directs the modulated phase control signal to a demodulator 262, which demodulates the phase control signal, and applies the phase control signal to a logic circuit 264, which converts the phase control signals to signals which are understood by phase shifters 258 and 259, and applies the translated control signals over bus 265 to control input port 259c of phase shifter 259, and to corresponding input port 258c of phase shifter 258. When two phase shifters are used rather than one, logic circuit 264 also adjusts the control signals applied to the two phase shifters 258, 259, so that the phase shifters are controlled in mutual opposition, or in mutually opposite directions, which is to say that when phase shifter 258 is increasing in phase delay, phase shifter 259 is decreasing in phase delay, and vice versa.

Figure 3:
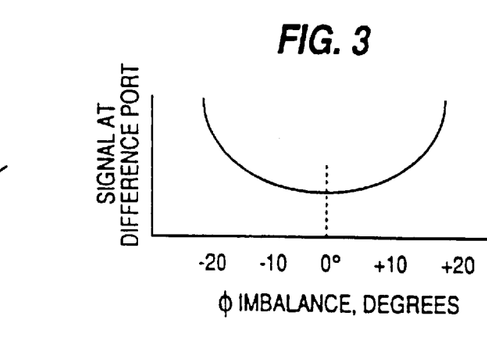

FIG. 3 illustrates the relative magnitude of the null signal at null port 248 of output combiner 242 of paralleled amplifier 206 of FIG. 2a. As illustrated in FIG. 3, the magnitude (generally measured as voltage or power) of the null signal is a minimum, but not necessarily zero, when the phase difference is zero degrees, and rises as the phase deviates from zero in either positive or negative direction.

As mentioned, the control signal produced by logic circuit 270 of FIG. 2b is the same, in principle, as that produced by the prior art controller. If two phase shifters 258, 259 are used, as illustrated in FIG. 2a, the maximum range, or phase shift which each must be capable of achieving, is 180°, because each elemental or individual amplifier 236, 238 can only be delayed by 180° relative to the other; the phase shifter in the leg opposite to the one which is delayed by 180° is set to its maximum delay or phase shift in order to equalize the phase shifts. On the other hand, if only one phase shifter is used, then its range must be 360°, and it must start or have its nominal value in the middle of its phase range, so that an amplifier in the opposite leg which is phase delayed by up to 180° relative to the leg with the phase shifter can be accommodated by increasing the phase delay in the first leg, while a relative phase delay of up to 180° in the leg with the phase shifter can be accommodated by decreasing the phase delay in the phase shifter.

When one of the individual or elemental amplifiers 236 or 237 ultimately fails, only that one which has failed needs to be replaced, since the series combination of the phase shifter 258 with switching arrangement 281 in channel 271, and phase shifter 259 with switching arrangement 282 in channel 272 allows independent control of the relative phase at the combiner, as described above. When one of amplifiers 136 or 138 is substituted in either channel 271 or 272 of FIG. 2a, its gain may be expected to exceed the gain of the amplifier already in use in that channel. Consequently, it may be necessary to remotely control the attenuation of the attenuator 156 or 157, in order to bring the gain of the newly substituted amplifier close to that of the amplifier previously in use, or to allow the AOC to operate. Similarly, it may be necessary to adjust the phase of the newly added amplifier. However, there is no need to associate a phase shifter with each of the substitute amplifiers. Instead, as illustrated in FIG. 2a, one phase shifter 258 or 259 is permanently associated with each channel 271 or 272, respectively, of paralleled amplifier 206, rather than with each elemental amplifier 256, 257, 156, 157. As mentioned above, a single phase shifter may be used instead of a pair of phase shifters, one in each leg, if its range is sufficient. When the replacement elemental amplifier is substituted for a defective amplifier without replacement of both amplifiers of the paralleled pair, the phase correction controller slews the phase shifts toward the correct values. Even if the initial phases of the two channels 271 and 272 are completely the reverse of the desired phase relationship at the moment of switching a spare elemental amplifier into the paralleled amplifier 206, the elemental amplifiers are not harmed, but the signal at null output port 248 of hybrid combiner 242 becomes a peak, and no, or very little, signal appears at sum output port 250.

It should be noted that while amplifier 136 has been described as being associated with channel 271 because its B and C terminals connect to switching arrangement 291 and 292, respectively, amplifier 136 may be located in a "pool" 298 of reserve amplifiers, each of which can be coupled in more than one switching arrangement, such as 271, 272, or other corresponding switching arrangements of other paralleled amplifiers, not illustrated.

Thus, a spacecraft (10) according to the invention includes a paralleled RF amplifier arrangement (206 of FIG. 2) for amplifying signals from an RF source (210), and for supplying amplified signals to a load (14). The paralleled amplifier arrangement (206) includes an input signal splitter (222) including an input port (220) at which the RF signals from the RF source (210) are received, and also includes first (228) and second (230) output ports at which nominally equal-amplitude samples of the input signal are produced. An output hybrid combiner (242) includes first (240) and second (244) input ports, and sum (250) and difference (248) output ports. The sum port (250) is coupled to the load, which in one embodiment of the invention is an antenna (14), for combining at the sum port (250) those components of signal applied to the first (240) and second (244) input ports of the combiner (242) which are in phase quadrature, and for coupling to the difference output port (248) those components of signal applied to the first (240) and second (244) input ports of the combiner (242) which are in-phase. A first channel (271) extends from the first output port (228) of the splitter (222) to the first input (240) port of the combiner (242). The first channel (271) includes the cascade of (an arrangement in which the signal passes sequentially through, although not necessarily in the order stated) a first phase shifter (258) and a first switching arrangement (281). The first switching arrangement (281) includes a single-pole, multiple-throw first switch (291) having a common or moving pole $291_M$ and at least first ($291_1$) and second ($291_2$) individual poles which may individually be switched into communication with the common pole ($291_M$) of the first switch (291). The common pole ($291_M$) of the first switch (291) is coupled (by way of phase shifter 258 in one embodiment) to the first output port (228) of the signal splitter (222). In a particular embodiment of the invention, the first phase shifter (258) precedes the first switching arrangement (281) in the first channel (271), so that the common pole ($291_M$) of the first switch (291) is coupled to the first output port (228) of the splitter (222) by way of the first phase shifter (258). The first switching arrangement (281) of first channel (271) also includes a single-pole, multiple-throw second switch (292) having a common pole (292$_M$) and at least first (292$_1$) and second (292$_2$) individual poles which may be individually switched into communication with the common pole (292$_M$) of the second switch (292). The common pole (292$_M$) of the second switch (292) is coupled to the first input port (240) of the combiner (242). The first (290) and second (292) switches are ganged together for simultaneous actuation, so that in a first switch state (the state illustrated in FIG. 2) the common poles (291$_M$, 292$_M$) of the first (291) and second (292) switches connect to the first individual poles (291$_1$, 292$_1$) of the first (291) and second (292) switches, respectively, and in a second switch state (other than that illustrated in FIG. 2) the common poles (291$_M$, 292$_M$) of the first (291) and second (292) switches are connected to the second individual poles (291$_2$, 292$_2$) of the first (291) and second (292) switches, respectively. The first switching arrangement (281) further comprises at least first (236) and second (136) amplifier arrangements. Each of the amplifier arrangements (236, 136) includes an input port (236$i$, 136$i$) to which signal to be amplified may be applied, and an output port (236$o$, 136$o$) at which amplified signal appears when signal to be amplified is applied to the input port of the amplifier arrangement. The first amplifier arrangement (236) has its input port (236$i$) coupled (by way of an attenuator 256) to the first individual pole (291$_1$) of the first switch (291) and its output port (236$o$) coupled to the first individual pole (292$_1$) of the second switch (292), and the second amplifier arrangement (136) has its input port (136$i$) coupled (by way of an attenuator 156) to the second individual pole (291$_2$) of the first switch (291) and its output port (136$o$) coupled to the second individual pole (292$_2$) of the second switch (292), whereby, when the first (291) and second (292) switches have their common poles (291$_M$, 292$_M$) contacting their first individual poles (291$_1$, 292$_1$), the first amplifier arrangement (236), and not the second amplifier arrangement (136), is coupled for amplification in the first channel (271), and when the first (291) and second (292) switches have their common poles (291$_M$, 292$_M$) contacting their second individual poles (291$_2$, 292$_2$), the second amplifier (136) arrangement, and not the first amplifier arrangement (236), is coupled for amplification in the first channel (271).

A second channel (272) extends from the second output port (230) of the signal splitter (222) to the second input port,(244) of the combiner (242). The second channel (272) includes at least a second switching arrangement (282), and may contain the cascade of a second phase shifter (259) with the second switching arrangement. The second switching arrangement (282) includes a single-pole, multiple-throw third switch (293). The third switch (293) has a common pole (293$_M$)and at least first (293$_1$) and second (293$_2$) individual poles which may individually be switched into communication with the common pole (293$_M$) of the third switch (293). The common pole (293$_M$) of the third switch (293) is coupled to the second output port (230) of the splitter (222). In an embodiment of the invention, the second phase shifter (259) precedes the second switching arrangement (282) in the cascade, so the common pole (293$_M$) of the third switch (293) in this embodiment is coupled to the second output port (230) of the splitter (222) by way of the second phase shifter (259). The second channel (272) also includes a single-pole, multiple-throw fourth switch (294). The fourth switch (294) has a common pole (294$_M$)and at least first (294$_1$) and second (294$_2$) individual poles which may be individually switched into communication with the common pole (294$_M$) of the fourth switch (294). The common pole (294$_M$) of the fourth switch (294) is coupled to the second input port (244) of the combiner (242). The third (293) and fourth (294) switches are ganged together for simultaneous actuation, so that in one switch state, the common poles (293$_M$, 294$_M$) of the third (293) and fourth (294) switches couple to the first individual poles (293$_1$, 294$_1$) of the third (293) and fourth (294) switches, respectively, and in a second switch state, the common poles (293$_M$, 294$_M$) of the third (293) and fourth (294) switches couple to the second individual poles (293$_2$, 294$_2$) of the third (293) and fourth (294) switches, respectively. The second switching arrangement (282) further comprises at least third (238) and fourth (138) amplifier arrangements. Each of the third (238) and fourth (138) amplifier arrangements includes an input port (238$i$, 138$i$) to which signal to be amplified may be applied, and an output port (238$o$, 138$o$) at which amplified signal appears when signal to be amplified is applied to the input port of the amplifier arrangement. The third amplifier arrangement (238) has its input port (238$i$) coupled to the first individual pole (293$_1$) of the third switch (293), and its output port (238$o$) coupled to the first individual pole (294$_1$) of the fourth switch (294). The fourth amplifier arrangement (138) has its input port (138$i$) coupled to the second individual pole (293$_2$) of the third switch (293) and its output port (138$o$) coupled to the second individual pole (294$2$) of the fourth switch (294). As a result of these connections, when the third (293) and fourth (294) switches have their common poles (293$_M$, 294$_M$) contacting their first individual poles (293$_1$, 294$_1$), the third amplifier arrangement (238), and not the fourth amplifier arrangement (138), is coupled for amplification in the second channel (272), and when the third (293) and fourth (294) switches have their common poles (293$_M$, 294$_M$) contacting their second individual poles (293$_2$, 294$_2$), the fourth amplifier arrangement (138), and not the third amplifier arrangement (238), is coupled for amplification in the second channel (272).

A null detection arrangement, including null detector 254 of FIG. 2$a$, modulator 260, directional coupler 212, paralleled amplifier 206, multiplexer 214, antenna 14, antenna 16 of FIG. 2$b$, and signal path 15 extending therebetween, multiplexer/demultiplexer 266, demodulator 268, logic 270, and modulator 272 of FIG. 2$b$, demodulatoy 262 of FIG. 2$a$, logic 264, and bus 265 coupled to control input port 259$c$, is coupled to the difference output port (248) of the output hybrid combiner (242) and to at least one of the first and second phase shifters (258, 259), for controlling the phase of at least the one of the phase shifters (258, 259) in a manner which tends to maximize the signal amplitude at the sum output port (250) of the combiner (242).

In a particular embodiment of the invention, the input signal splitter (222) comprises a 3 dB, 90° hybrid. The presence of the hybrid (222) provides phase shifts to the signals traversing the first (271) and second (272) channels which reduces the phase correction required in one of the channels. In a particular embodiment of the invention, the null detection arrangement (254, 260, 212, 206, 214, 14, 16, 15, 266, 268, 270, 272, 262, 264, and 265) coupled to control input port 259$c$ of at least one of the phase shifters (258, 259) includes an amplitude detector (254) coupled to the difference output port (248) of the hybrid combiner (242) of the paralleled amplifier (206)at the spacecraft (10), for generating a null-representative signal. A modulator (260) is coupled to the null detection arrangement, also at the spacecraft (10), for modulating the null-representative signal onto an RF carrier to thereby generate modulated carrier. A transmitter (206, 214, 14) at the spacecraft is coupled to the modulator, for transmitting the modulated carrier by way of a signal path 15 to a ground station (18). The transmitter (206, 214, 14) may include the same parallel amplifier(s) (206) and antenna(s) (14) which are used for the traffic signals, or the transmitter may be an independent transmitter. A receiver (16, 266, 268, 270, 272) at the ground station (18) receives the modulated carrier transmitted to the ground station, for generating a received modulated null-representative signal. At the ground station, a demodulator (268) is coupled to the receiver, for demodulating the received modulated null-representative signal, for thereby generating demodulated null-representative signal. A processor (270), such as a microprocessor, located at the ground station (18), processes the null-representative signals, for generating phase shifter control signals. A second modulator (272), located at the ground station (18), is coupled to the processor (270), for modulating the phase shifter control signals onto an RF carrier, to thereby form modulated phase shifter control signals. The modulated phase shifter control signals are applied to a transmitter (272, 266, 16) located at the ground station (18), for transmitting the modulated phase shifter control signals toward the spacecraft. At the spacecraft, a second receiver (14, 214) receives the modulated phase shifter control signals, for forming received modulated phase shifter control signals. At the spacecraft (10), a second demodulator (262) is coupled to the second receiver (14, 214) and (by way of logic circuit 264 and bus 265) to at least one of the first (258) and second (259) phase shifters, for demodulating the modulated phase shifter control signals, and for applying the resulting phase shifter control signals to at least the one of the first (258) and second (259) phase shifters of the first (271) and second (272) channels, respectively, in a manner which tends to minimize the null signal at the null port (248) of the combiner (242), and which thereby tends to maximize the sum signal at the sum port (250) of the power combiner (242) of the parallel amplifier (206).

Other embodiments of the invention will be apparent to those skilled in the art. For example, the amplifiers may be travelling-wave tubes, solid-state amplifiers negative-resistance amplifiers such as tunnel-diode amplifiers, or any kind of amplifier which provides gain at RF frequencies. While the description has been in terms of two parallel amplifiers with a splitter coupled to their inputs and a combiner coupled to their outputs, the paralleled amplifier may itself have paralleled amplifiers for each of its constituent amplifiers. While phase shifters 258 and 259 have been described, those skilled in the art know that delay elements can be used instead, as described in U.S. Pat. No. 4,701,716, issued Oct. 20, 1987 in the name of Poole. While only an embodiment in which the null signal is downlinked to a ground station has been illustrated, those skilled in the art will recognize that the phase control logic controller 270 of FIG. 3 could be located on-board the spacecraft, thereby eliminating the null signal downlink apparatus and the control signal uplink apparatus, making the spacecraft more autonomous in regard to phase control. When the phase controller is on-board in this manner, it is advantageous if the controller can be reprogrammed as new conditions or control techniques arise. While the phase shifters 258, 259 have been described as five-bit phase shifters, other digital phase shifters with different numbers of bits could be used, or analog phase shifters could be used instead of digital phase shifters. Those functions which are not identified as being either digital or analog may be either, depending upon circumstances. Where the word "between" is used for electrical coupling, the word has no physical significance, but rather indicates those elements to which coupling is made.

What is claimed is:

1. A spacecraft, including a paralleled RF amplifier arrangement for amplifying signals from an RF source, and for supplying amplified signals to a load, said paralleled amplifier arrangement comprising:

an input signal splitter including an input port at which said RF signals from said RF source are received, and also including first and second output ports at which nominally equal-amplitude samples of said input signal are produced;

an output hybrid combiner including first and second input ports and sum and difference output ports, said sum port being coupled to said load, for combining at said sum port those components of signal applied to said first and second input ports of said combiner which are in phase quadrature, and for coupling to said difference output port those components of signal applied to said first and second input ports of said combiner which are in-phase;

a first channel extending from said first output port of said splitter to said first input port of said combiner, said first channel including the cascade of a first phase shifter and a first switching arrangement, said first switching arrangement including a single-pole, multiple-throw first switch having a common pole and at least first and second individual poles which may individually be switched into communication with said common pole of said first switch, said common pole of said first switch being coupled to said first output port of said splitter, said first channel also including a single-pole, multiple-throw second switch having a common pole and at least first and second individual poles which may be individually switched into communication with said common pole of said second switch, said common pole of said second switch being coupled to said first input port of said combiner, said first and second switches being ganged together for simultaneously connecting said common poles of said first and second switches to one of said first and second individual poles of said first and second switches, respectively, said first switching arrangement further comprising at least first and second amplifier arrangements, each of said amplifier arrangements including an input port to which signal to be amplified may be applied, and an output port at which amplified signal appears when signal to be amplified is applied to said input port of said amplifier arrangement, said first amplifier arrangement having its input port coupled to said first individual pole of said first switch and its output port coupled to said first individual pole of said second switch, said second amplifier arrangement having its input port coupled to said second individual pole of said first switch and its output port coupled to said,second individual pole of said second switch, whereby, when said first and second switches have their common poles contacting their first individual poles, said first amplifier arrangement, and not said second amplifier arrangement, is coupled for amplification in said first channel, and when said first and second switches have their common poles contacting their second individual poles, said second amplifier arrangement, and not said first amplifier arrangement, is coupled for amplification in said first channel;

a second channel extending from said second output port of said splitter to said second input port of said combiner, said second channel including at least a second switching arrangement, said second switching arrangement including a single-pole, multiple-throw third switch having a common pole and at least first and second individual poles which may individually be switched into communication with said common pole of said third switch, said common pole of said third switch being coupled to said second output port of said splitter, said second channel also including a single-pole, multiple-throw fourth switch having a common pole and at least first and second individual poles which may be individually switched into communication with said common pole of said fourth switch, said common pole of said fourth switch being coupled to said second input port of said combiner, said second and third switches being ganged together for simultaneously connecting said common poles of said third and fourth switches to one of said first and second individual poles of said third and fourth switches, respectively, said second switching arrangement further comprising at least third and fourth amplifier arrangements, each of said third and fourth amplifier arrangements including an input port to which signal to be amplified may be applied, and an output port at which amplified signal appears when signal to be amplified is applied to said input port of said amplifier arrangement, said third amplifier arrangement having its input port coupled to said first individual pole of said third switch and its output port coupled to said first individual pole of said fourth switch, said fourth amplifier arrangement having its input port coupled to said second individual pole of said third switch and its output port coupled to said second individual pole of said fourth switch, whereby, when said third and fourth switches have their common poles contacting their first individual poles, said third amplifier arrangement, and not said fourth amplifier arrangement, is coupled for amplification in said second channel, and when said third and fourth switches have their common poles contacting their second individual poles, said fourth amplifier arrangement, and not said third amplifier arrangement, is coupled for amplification in said second channel; and null detection means coupled to said difference output port of said output hybrid combiner and to at least said first phase shifter, for controlling the phase of at least said first phase shifter in a manner which tends to maximize the signal amplitude at said sum output port of said combiner.

2. A spacecraft according to claim 1, wherein said input signal splitter comprises a 3 dB, 90° hybrid.

3. A spacecraft according to claim 1, wherein said null detection means comprises:

at said spacecraft, amplitude detection means coupled to said difference output port of said output hybrid combiner, for generating a null-representative signal;

at said spacecraft, modulating means coupled to said amplitude detection means, for modulating said null-representative signal onto an RF carrier to thereby generate modulated carrier;

at said spacecraft, transmitting means coupled to said modulating means, for transmitting said modulated carrier to a ground station;

at said ground station, receiving means for receiving said modulated carrier transmitted to said ground station, for generating a received modulated null-representative signal;

at said ground station, demodulating means coupled to said receiving means, for demodulating said received modulated null-representative signal, for generating demodulated null-representative signal;

at said ground station, processing means coupled to said demodulating means for generating phase shifter control signals;

at said ground station, second modulating means coupled to said processing means for modulating said phase shifter control signals onto an RF carrier, to thereby form modulated phase shifter control signals;

at said ground station, second transmitting means coupled to said second modulating means, for transmitting said modulated phase shifter control signals toward said spacecraft;

at said spacecraft, second receiving means for receiving said modulated phase shifter control signals, for forming received modulated phase shifter control signals;

at said spacecraft, second demodulating means coupled to said second receiving means and to said first phase shifters, for demodulating said modulated phase shifter control signals, and for applying the resulting phase shifter control signals to at least said first phase shifter, in a manner which tends to minimize said null, and thereby tends to maximize the sum signal at said sum port of said power combiner.

4. A spacecraft according to claim 1, wherein:

said first phase shifter is cascaded with said first switching arrangement in a manner which couples said first phase shifter between said first output port of said input signal splitter and said common pole of said first switch; and wherein said second channel includes a second phase shifter, and said second phase shifter is cascaded with said second switching arrangement in a manner which couples said second phase shifter between said second output port of said input signal splitter and said common pole of said third switch, whereby the attenuation of said first and second phase shifters does not reduce the combined signal output power.

5. A spacecraft according to claim 4, wherein said null detection means produces phase shifter control signals in such a manner that said first and second phase shifters are controlled in a mutually opposed manner.

* * * * *